United States Patent
Ikuta

(10) Patent No.: US 7,796,665 B2
(45) Date of Patent: Sep. 14, 2010

(54) SURFACE EMITTING LASER

(75) Inventor: Mitsuhiro Ikuta, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 409 days.

(21) Appl. No.: 11/916,230

(22) PCT Filed: Apr. 5, 2007

(86) PCT No.: PCT/JP2007/058018

§ 371 (c)(1),
(2), (4) Date: Nov. 30, 2007

(87) PCT Pub. No.: WO2007/119761

PCT Pub. Date: Oct. 25, 2007

(65) Prior Publication Data

US 2010/0014548 A1    Jan. 21, 2010

(30) Foreign Application Priority Data

Apr. 12, 2006    (JP) .............................. 2006-109913

(51) Int. Cl.
*H01S 5/00* (2006.01)
(52) U.S. Cl. .............................. 372/50.124; 372/43.01; 372/50.11
(58) Field of Classification Search ............ 372/50.124, 372/50.11
See application file for complete search history.

(56) References Cited

U.S. PATENT DOCUMENTS

| | | | |
|---|---|---|---|
| 5,231,642 A | 7/1993 | Scifres et al. | 372/45 |
| 6,603,605 B1 | 8/2003 | Bienstman et al. | 359/588 |
| 7,031,360 B2 | 4/2006 | Ledentsov et al. | 372/43 |
| 2003/0152120 A1 | 8/2003 | Ledenstov et al. | 372/45 |
| 2004/0013157 A1 * | 1/2004 | Deng et al. | 372/97 |
| 2005/0117623 A1 | 6/2005 | Shchukin et al. | 372/43 |
| 2006/0024013 A1 | 2/2006 | Magnusson et al. | 385/129 |
| 2007/0177647 A1 | 8/2007 | Noda et al. | 372/50.1 |

(Continued)

FOREIGN PATENT DOCUMENTS

JP    2003-273456 A    9/2003

(Continued)

OTHER PUBLICATIONS

Ledenstsov, Novel Approaches to Semiconductor Lasers, 2002.*

(Continued)

*Primary Examiner*—Dung T Nguyen
(74) *Attorney, Agent, or Firm*—Fitzpatrick, Cella, Harper & Scinto

(57) ABSTRACT

The present invention provides a surface emitting laser having a novel structure which eliminates necessity to provide a low refractive index medium at an interface of a photonic crystal layer on the side of a substrate. A multilayer mirror (1300), an active layer (1200), and a refractive index periodic structure layer (1020) whose refractive index changes periodically are laminated in a direction perpendicular to a substrate (1500). The refractive index periodic structure layer is structured so as to separate a light having a wavelength λ perpendicularly incident on the refractive index periodic structure into at least a transmitted light and a diffracted light. The multilayer mirror is structured so as to have a reflectance with regard to the diffracted light higher than a reflectance with regard to the transmitted light. A resonant mode is realized within a waveguide including the refractive index periodic structure layer and the multilayer mirror.

4 Claims, 3 Drawing Sheets

U.S. PATENT DOCUMENTS

| | | | |
|---|---|---|---|
| 2008/0031295 A1 | 2/2008 | Tanaka | 372/44.01 |
| 2008/0107145 A1 | 5/2008 | Hori et al. | 372/99 |
| 2008/0112442 A1 | 5/2008 | Ikuta | 372/19 |

FOREIGN PATENT DOCUMENTS

| | | |
|---|---|---|
| WO | WO 2005/086302 A1 | 9/2005 |
| WO | WO 2005/101598 A1 | 10/2005 |

OTHER PUBLICATIONS

Ledenstov, N.N. et al., "Novel Approaches to Semiconductor Lasers", Proc. SPIE, vol. 4905, pp. 222-234.

PCT Notification of Transmittal of the International Search Report and the Written Opinion of the International Searching Authority, or the Declaration, International Search Report and Written Opinion of the International Searching Authority, dated Jan. 22, 2008, regarding International Application No. PCT/JP2007/058018.

Hattori, et al., "Analysis of Hybird Photonic Crystal Vertical Cavity Surface Emitting Lasers", vol. 11, No. 5 (2003), Optics Express 1799.

Ledentsov, et al., "Novel Concepts for Injection Lasers", vol. 41, No. 12 (2002), Optical Engineering.

Bakir, et al., "Surface-emitting Microlaser Combining Two-Dimensional Photonic Crystal Membrane and Vertical Bragg Mirror", Applied Physics Letters 88 081113 (2006).

Ledentsov, et al., "Unique Properties of Quantum Dot Lasers", Nanotechnology, 2003.

\* cited by examiner

SURFACE EMITTING LASER

TECHNICAL FIELD

The present invention relates to a surface emitting laser.

BACKGROUND ART

In recent years, researches on optical devices using photonic crystals are actively conducted. APPLIED PHYSICS LETTERS 88, 081113 (2006) discloses a technique concerning a surface emitting laser including a two-dimensional photonic crystal and a multilayer mirror.

More specifically, as illustrated in FIG. 5, a Bragg mirror 3100 comprised of Si layers 3110 and $SiO_2$ layers 3120 alternately laminated is provided on an Si substrate 3000. A two-dimensional photonic crystal slab 3300 is provided over the Bragg mirror 3100 via a bonding layer 3200 of $SiO_2$. The two-dimensional photonic crystal slab 3300 includes $In_{0.53}Ga_{0.47}As$, a barrier layer of InP, and a quantum well layer of $InAs_{0.65}P_{0.35}$. In this structure, the average refractive index of the slab 3300 is estimated to be about 3.2.

Air having a refractive index of 1.0 forms a two-dimensional photonic crystal slab interface on the side opposite to the substrate. The bonding layer 3200 ($SiO_2$) having a refractive index of about 1.4 forms a two-dimensional photonic crystal slab interface on the side of the substrate.

Because air and the bonding layer 3200 which are media having refractive indices lower than that of the slab 3300 are provided on both sides of the slab in this way, light generated in the slab 3300 is confined within the slab 3300. As a result, a resonant mode (an amplification mode for laser oscillation) is realized in an inplane direction of the slab 3300. Further, because, in addition to the inplane resonant mode, there is also a radiation mode in a direction perpendicular to the inplane direction, a surface emitting laser is realized.

It is also stated that some light actually leaks from the slab 3300, and by returning light which has leaked to the side of the substrate by the Bragg mirror, a Q value is increased.

DISCLOSURE OF THE INVENTION

However, in a structure where the resonant mode is realized in the photonic crystal slab as described above, it is necessary to dispose media having refractive indices lower than that of the slab over and under the slab at the interfaces. This is because, unless the slab is sandwiched between media having refractive indices lower than that of the slab, no waveguide mode is realized in the slab.

In particular, providing a medium having a low refractive index at an interface of the photonic crystal slab on the side of the substrate is a constraint on the manufacturing process. In the above-mentioned publicly known document, because InP can not be grown directly on Si or $SiO_2$, lamination techniques are employed.

Accordingly, the present invention provides a surface emitting laser having a novel structure which eliminates the necessity to provide, at an interface of a refractive index periodic structure layer the refractive index of which changes periodically (hereinafter occasionally referred to as photonic crystal layer or PhC layer) on the side of a substrate, a medium having a refractive index lower than that of the PhC layer.

The present invention in its first aspect provides a surface emitting laser which oscillates at a wavelength λ includes a multilayer mirror, an active layer, and a refractive index periodic structure layer whose refractive index changes periodically. The multilayer mirror, the active layer, and the refractive index periodic structure layer are laminated in a direction perpendicular to a substrate. The refractive index periodic structure layer separates a light having a wavelength λ perpendicularly incident on the refractive index periodic structure layer into at least a transmitted light and a diffracted light. The multilayer mirror has a reflectance with regard to the diffracted light which is higher than a reflectance with regard to the transmitted light. A waveguide including the refractive index periodic structure layer and the multilayer mirror has a resonant mode.

According to the present invention, there is provided a surface emitting laser having a novel structure which eliminates the necessity to provide, at an interface of a PhC layer on the side of a substrate, a medium having a refractive index lower than that of the PhC layer.

Further features of the present invention will become apparent from the following description of exemplary embodiments with reference to the attached drawings.

BEST MODE FOR CARRYING OUT THE INVENTION

Figure 1:
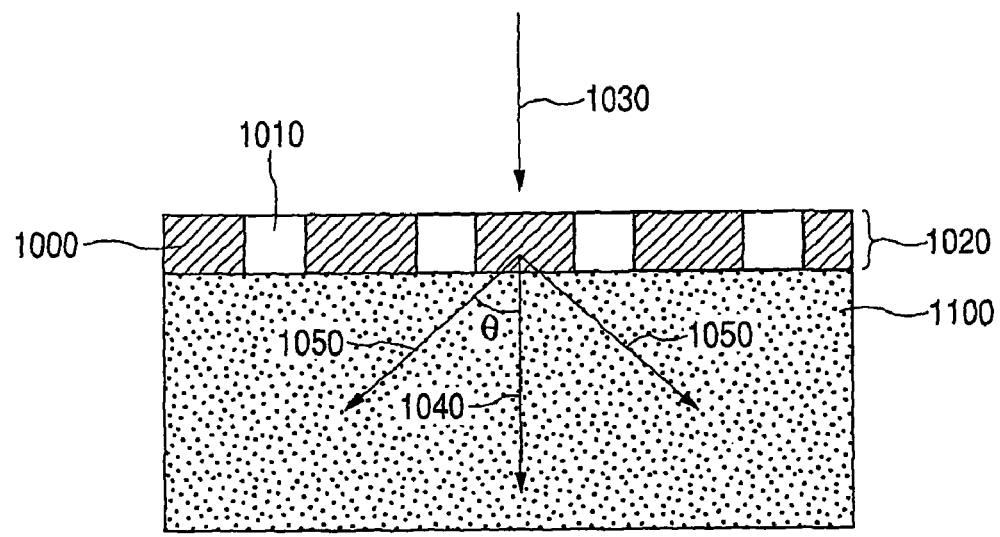
FIG. 1 is a schematic sectional view of a photonic crystal layer for describing the present invention.

The present invention is described with reference to FIG. 1 and FIG. 2. FIG. 1 is a view for describing a photonic crystal layer applied to the present invention.

In FIG. 1, a two-dimensional photonic crystal layer 1020 includes periodically provided pores 1010 and a region 1000 for isolating the pores 1010. A two-dimensional photonic crystal layer means a layer having a two-dimensional periodical change of the refractive index.

A clad layer 1100 is adjacent to the photonic crystal layer 1020. Incident light 1030 which enters perpendicularly to the photonic crystal layer becomes transmitted light 1040 and diffracted light 1050.

In the present invention, as the diffracted light 1050, diffracted light which is obtained by diffraction at an angle θ (θ is neither 0° nor 90°) of the incident light 1030 which enters the photonic crystal layer and has an oscillation wavelength λ is used. Details of the photonic crystal layer for realizing such diffraction are described later. The transmitted light 1040 forms an angle of 0° with respect to the direction of incidence of the incident light 1030.

Figure 2:
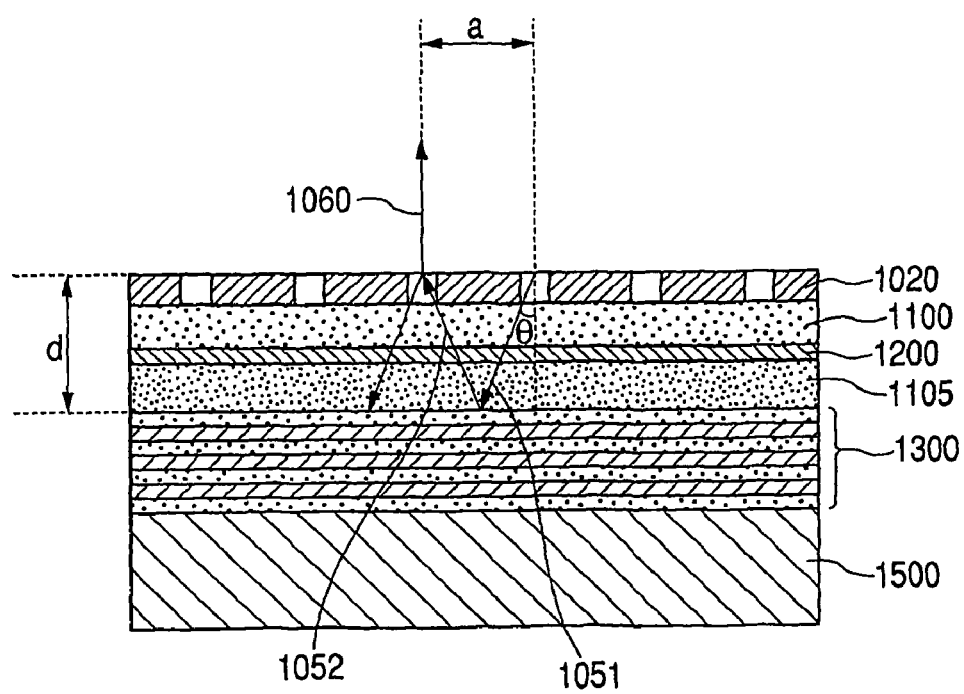
FIG. 2 is a schematic sectional view of a surface emitting laser for describing the present invention.

FIG. 2 is a schematic sectional view for describing a surface emitting laser according to the present invention.

A substrate 1500 has a multilayer mirror (DBR, Distributed Bragg Reflector) 1300 formed thereon. Further, a lower clad layer 1105, an active layer 1200, an upper clad layer 1100, and a photonic crystal layer 1020 are formed on the multilayer mirror 1300. It is to be noted that the direction of lamination of the multilayer mirror 1300 is perpendicular to the substrate 1500.

Usually, the multilayer mirror 1300 is designed such that the reflectance of light which is perpendicularly incident on the mirror is the highest.

However, in the present invention, thicknesses of the respective layers in the multilayer mirror are designed such that reflectance of light which is incident on the substrate at an angle θ (set, for example, in a range of 20° to 80°) with respect to the perpendicular direction (corresponding to 1050 in FIG. 1) (second reflectance) is higher than reflectance of light which is perpendicularly incident on the substrate (first reflectance). For example, the design is performed such that the second reflectance is 99 percent or more and 100 percent or less. The design is performed, more preferably, such that the second reflectance is 99.9 percent or more, and still more preferably, such that the second reflectance is 99.99 percent or more. The more the second reflectance approaches 100 percent, the more preferable it is.

Further, a distance d between an interface of the photonic crystal layer 1020 on a side of air and the multilayer mirror 1300 is designed as in the following.

That is, an optical path length which is a sum of an optical path 1051 of light incident on the multilayer mirror 1300 at the angle θ and an optical path 1052 of light reflected by the multilayer mirror to return to a position that is away by a spacing 'a' between the pores is made to be an integer-fold length of the oscillation wavelength λ.

Next, an exemplary case where the surface emitting laser according to the present invention is actually designed is described.

First, the oscillation wavelength λ is determined. Then, the spacing (lattice spacing) a between the pores in the photonic crystal formed in the form of a tetragonal lattice when the photonic crystal layer is viewed from a direction perpendicular to the substrate for a plan view thereof is determined. The lattice structure of the photonic crystal is not limited to a tetragonal lattice, and may be, for example, a triangular lattice structure.

The design is performed such that when the light 1051 which is incident on the multilayer mirror from a position of a certain pore at the angle θ is reflected by the mirror to return to a position that is away by the spacing a the phase matching condition is satisfied.

The condition for the diffraction at the angle θ of light perpendicularly incident on the photonic crystal layer is $n \cdot a \cdot \sin \theta = m\lambda$, where n is an effective refractive index of the clad layer 1100 in FIG. 2. It is to be noted that, in some cases, the effective refractive index n involves an influence of the active layer 1200 and the clad layer 1105 on the side of the substrate, which is required to be taken into consideration.

Although m is a natural number, the description in the following is made on the assumption that m=1. In the diffraction conditions described above, θ is determined when λ and 'a' are determined. It is preferable that the range of θ exceeds a critical angle of total reflection at an interface between the photonic crystal layer and air. When θ is determined, d is geometrically determined.

When d is determined, the optical path length which is the sum of the optical paths 1051 and 1052 is determined. Whether the optical path length satisfies the condition of an integer-fold of the oscillation wavelength (the phase matching condition) or not is confirmed. When the condition is not satisfied, 'a' is changed to perform the design such that the phase matching condition is satisfied.

Actually, it is preferable that the thickness d is designed in terms of effective thickness taking into consideration the Goos-Haenchen shift and the refractive index of the photonic crystal layer. Further, the diameter of the pores (when a section of a pore in the inplane direction of the substrate is a circle, such diameter means the diameter of the circle) is on the order of 40% of the lattice spacing. Actually, the diameter of the pores is designed to be in the range of 20% to 60% of the lattice spacing. The thickness of the photonic crystal layer is, for example, half of the lattice spacing a. It is to be noted that, although the above-mentioned phase matching condition is assumed to be satisfied when light returns to a position that is away from a certain pore by the spacing a, the phase matching condition may be assumed to be satisfied at a portion that is away by an integer-fold of 'a', for example.

The respective layers forming the multilayer mirror 1300 are designed as follows. That is, when the refractive index of each layer is $n_i$, the thickness of the layer is set to $\lambda/(4 \cdot n_i \cdot \cos \theta_i)$. Here, strictly speaking, $\theta_i$ is an angle formed by an interface of each layer and the travel direction of light, but there are some cases where it can uniformly be defined as an incident angle from the clad layer 1105 to the multilayer mirror.

In this way, the reflectance of each layer with regard to light incident on the multilayer mirror at the angle θ with respect to the perpendicular direction can be made at the maximum or close to the maximum. More specifically, the reflectance of light which is incident on the mirror at an angle θ can be made to be higher than the reflectance of light which is perpendicularly incident on the mirror. Further, because the reflectance of light incident on the multilayer mirror at an angle other than θ (for example, an angle θ+20°) is lower than that of light incident at the angle θ, confinement efficiency of other waveguide resonant modes when light is incident on the multilayer mirror at an angle other than θ is lowered. As a result, multimode oscillation can be suppressed.

Light incident on a lattice point of the photonic crystal layer from the side of the active layer maintains an angle formed by an axis perpendicular to the inplane direction of the substrate and the path of the incident light, and is diffracted to the side of the substrate in directions of the path of the incident light rotated by 0°, ±90°, and 180° with respect to the perpendicular axis. Light incident on the photonic crystal layer repeats the diffraction and the reflection at the multilayer reflector 1300 plural times and returns to the original incident light path, so resonance action is produced. Further, light amplified in the resonator is diffracted from the photonic crystal layer in a direction perpendicular to the substrate, that is, diffracted in a similar manner to diffracted light 1060, to have a surface emitting function. Because the same phenomenon is produced at all the lattice points, coherent laser oscillation is possible over the whole area.

As the active layer, one which emits light by carrier injection, one which emits light by an optical pump, or the like can be selected. A specific example is a multiple quantum well structure of a semiconductor. By locating the active layer at a position in the resonator where the strength of the electromagnetic field of a standing wave is large, a large gain can be given to the laser.

In this way, a surface emitting laser in which resonance is produced diagonally with respect to the direction of lamination of the multilayer mirror within a waveguide formed by the photonic crystal layer 1020 and the multilayer mirror 1300 can be realized.

In the present invention, as described above, the structure is formed such that a resonant mode exists within the waveguide formed by the photonic crystal layer 1020 and the multilayer mirror 1300. As a result, the necessity to confine light within the photonic crystal layer is eliminated, so it is not indispensable to dispose a low refractive index medium at the interface of the photonic crystal layer on the side of the substrate.

It is to be noted that, in the present invention, as long as the above-mentioned resonant mode is realized, a low refractive index medium may be disposed at the interface of the photonic crystal layer on the side of the substrate. The present invention is characterized just in that it is not indispensable to dispose such a low refractive index medium.

It is to be noted that a reflector (for example, a multilayer mirror) other than the above-mentioned multilayer mirror having a reflectance with regard to the transmitted light which is higher than a reflectance with regard to the diffracted light may be provided between the substrate and the multilayer mirror. This enables reflection of light emitted to the side of the substrate to the side of the active layer, and the extraction efficiency of surface-emitted light to the side opposite to the substrate side can be enhanced.

Further, the photonic crystal layer which can be applied to the present invention is, for example, of a refractive index periodic structure where the refractive index periodically and two-dimensionally changes in the inplane direction. The structure may be a tetragonal lattice structure or a triangular lattice structure.

A defect (a condition where the pore spacing is 'a' and a position that is away from a certain pore by 'a' does not have a pore which should be present there) may be introduced into the refractive index periodic structure. By introducing such a defect, the light extraction efficiency may be modulated at the defect. It is to be noted that the lattice forming the photonic crystal layer is not necessarily required to be pores, and the pores may be filled with a material having a refractive index which is different from that of its surrounding, for example, a resin.

The material of the photonic crystal layer may be, for example, a semiconductor, more specifically, $Al_{0.5}Ga_{0.5}As$ or $Al_{0.6}Ga_{0.4}N$.

The material of the multilayer mirror may be, for example, a semiconductor multilayer film, more specifically, $Al_{0.05}Ga_{0.5}As/GaAs$ or $Al_{0.6}Ga_{0.4}N/GaN$.

Exemplary Embodiment 1

Figure 3:
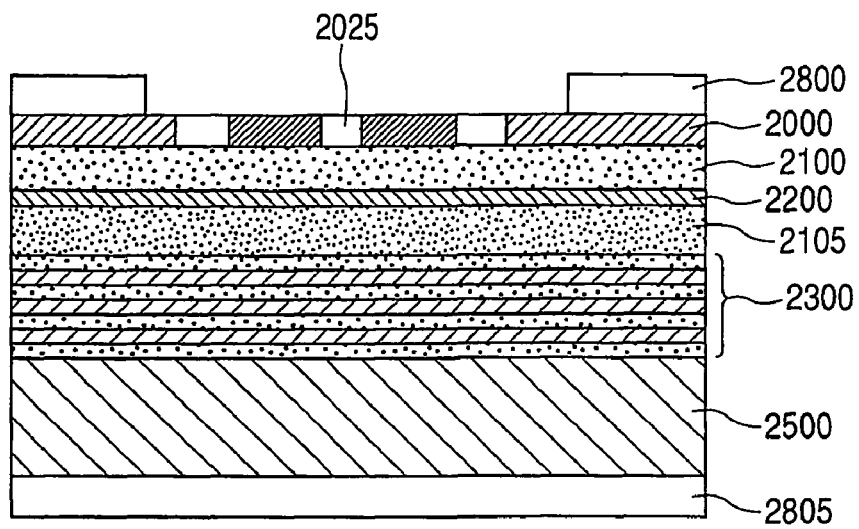
FIG. 3 is a schematic sectional view for describing an exemplary embodiment according to the present invention.

First, a first exemplary embodiment according to the present invention is described with reference to FIG. 3.

A multilayer reflector 2300 including seventy pairs of an n-$Al_{0.93}Ga_{0.07}As$ layer having a thickness of 59 nm and an n-$Al_{0.5}Ga_{0.5}As$ layer having a thickness of 52 nm is grown on a GaAs substrate 2500. The growing method is, for example, MOCVD.

The multilayer reflector is designed such that its reflectance with regard to light having a wavelength of 670 nm is maximized when the incident angle from the n-$Al_{0.93}Ga_{0.07}As$ clad is about 24°.

An n-$Al_{0.93}Ga_{0.07}As$ clad layer 2105, a GaInP/AlGaInP multiple quantum well layer 2200, a p-$Al_{0.93}Ga_{0.07}As$ clad layer 2100, and a p-$Al_{0.5}Ga_{0.5}As$ slab layer 2000 with which a resonator can be formed are grown on the multilayer reflector.

A resist is applied to an upper surface of the slab layer 2000. By electron beam exposure, two-dimensional tetragonal lattice circular patterns having a radius of 100 nm and a lattice spacing of 500 nm are formed on the resist.

After the resist is developed, reactive ion etching with $SiCl_4/Ar$ plasma is used to form a two-dimensional hole train 2025 in the p-$Al_{0.5}Ga_{0.5}As$ slab layer. After the hole train is formed, the resist is removed.

A lower electrode 2805 is formed under the substrate 2500 and an upper electrode 2800 is formed over the slab layer 2000.

When current is fed through the laser manufactured in this way, an active layer emits light, and by laser oscillation, laser light having a wavelength of 670 nm can be emitted in a direction perpendicular to the substrate.

Exemplary Embodiment 2

Figure 4:
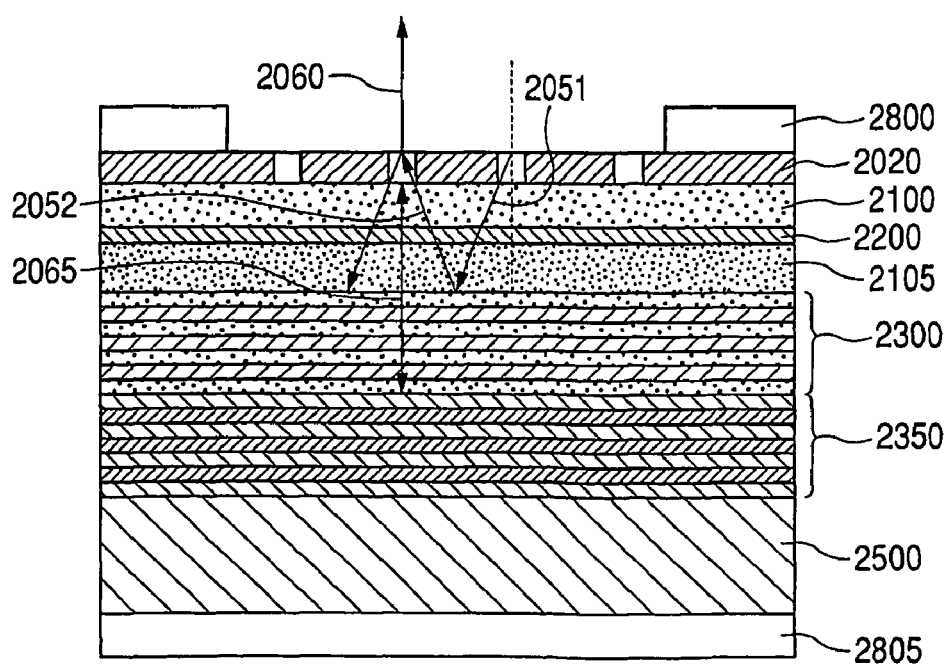
FIG. 4 is a schematic sectional view for describing an exemplary embodiment according to the present invention.
Figure 5:
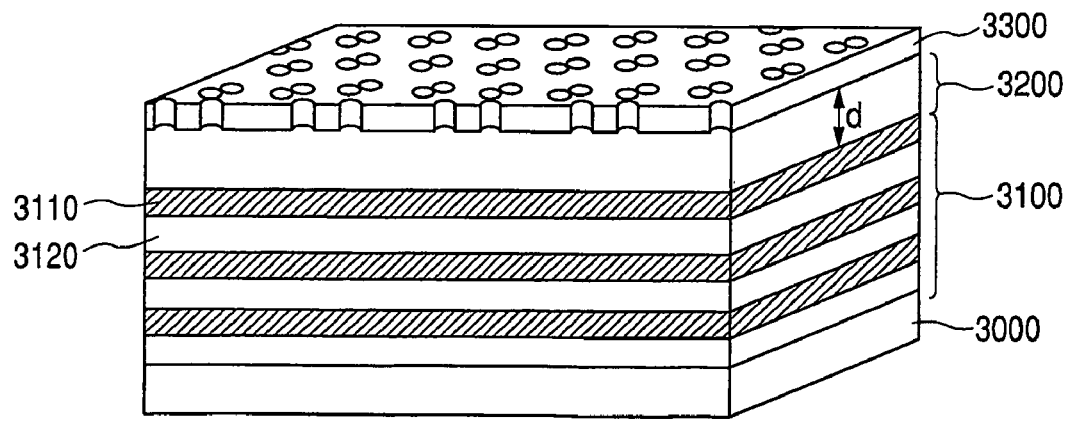
FIG. 5 is a view for describing background art.

A second exemplary embodiment according to the present invention is characterized by including a second multilayer reflector 2350 between the substrate 2500 and the multilayer reflector 2300 (which is a first multilayer reflector) of the first exemplary embodiment as shown in the FIG. 4 which illustrates a main part thereof.

The second multilayer reflector is characterized in that reflectance of light having a wavelength of laser oscillation which is perpendicularly incident on the reflector is higher than that of light which is obliquely incident.

More specifically, a second multilayer reflector 2350 including seventy pairs of an n-$Al_{0.93}Ga_{00.7}As$ layer having a thickness of 54 nm and an n-$Al_{0.5}Ga_{0.5}As$ layer having a thickness of 49 nm is grown on the substrate 2500, and the first multilayer reflector 2300 is formed thereon similarly to the case of the first exemplary embodiment.

Unlike the case of the first multilayer reflector, the reflectance of the second multilayer reflector with regard to light having a wavelength of 670 nm is maximized when the incident angle is a right angle.

Therefore, the second multilayer reflector has the function of returning to the side of an active layer 2200 light 2065 emitted from a laser resonator including the first multilayer reflector 2300, the photonic crystal layer 2020, and the active layer 2200 toward the side of the substrate in a direction perpendicular to the substrate.

As a result, light 2060 emitted to a side opposite to the substrate in the direction perpendicular to the substrate can be enhanced compared with a case where the second multilayer reflector is not present, so the light extraction efficiency of to the side opposite to the substrate of the surface emitting laser can be enhanced.

Although the present invention has been described using the two exemplary embodiments, the surface emitting laser according to the present invention is not limited to the exemplary embodiments but various modifications can be made within the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

In particular, the materials of the semiconductor layer, the photonic crystal, the multilayer mirror, and the electrodes, the form of the lattice of the photonic crystal, the structure of the multilayer mirror, and the like may be appropriately set. Further, although, in the above-mentioned exemplary embodiments, the wavelength of laser oscillation is 670 nm, the present invention is not limited thereto, and oscillation of an arbitrary wavelength is possible by selecting an appropriate material and an appropriate structure.

Further, although exemplary embodiments where the photonic crystal layer is provided in the slab layer (1000, 1020, 2000, 2100) are described, the photonic crystal layer may be provided in the upper clad layer 1100, the active layer 1200, the lower clad layer 1105, or the multilayer mirror 1300. Further, the refractive index periodic structure may be provided in such plural layers.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-109913, filed Apr. 12, 2006, which is hereby incorporated by reference herein in its entirety.

The invention claimed is:

1. A surface emitting laser that oscillates at a wavelength $\lambda$, comprising:
   a multilayer mirror;
   an active layer; and
   a photonic crystal layer whose refractive index changes periodically within a plane parallel to a substrate,
   wherein the multilayer, the active layer, and the photonic crystal layer are laminated in a direction perpendicular to the substrate,
   wherein the photonic crystal layer separates incident light having a wavelength $\lambda$ perpendicularly incident on the photonic crystal layer into at least a transmitted light and a diffracted light,
   wherein the multilayer minor has a reflectance with regard to the diffracted light which is higher than reflectance with regard to the transmitted light,
   wherein a waveguide including the photonic crystal layer and the multilayer mirror has a resonant mode within a plane parallel to the substrate, and
   wherein the photonic crystal layer is so configured as to diffract light of the resonant mode into a direction perpendicular to the substrate.

2. A surface emitting laser according to claim 1, wherein the photonic crystal layer includes one of a triangular lattice and a tetragonal lattice.

3. A surface emitting laser according to claim 1, wherein the transmitted light forms an angle of 0° with respect to a direction of incidence of the incident light, and wherein the diffracted light and the direction of incidence forms an angle other than 0° and 90°.

4. A surface emitting laser according to claim 1, wherein a reflector other than the multilayer mirror, having a reflectance with regard to the transmitted light that is higher than a reflectance with regard to the diffracted light, is provided between the substrate and the multilayer mirror.

* * * * *